(12) United States Patent
Oosawa et al.

(10) Patent No.: US 12,331,212 B2
(45) Date of Patent: Jun. 17, 2025

(54) RESIN COMPOSITION, COPPER FOIL WITH RESIN, AND PRINTED WIRING BOARD

(71) Applicant: MITSUI MINING & SMELTING CO., LTD., Tokyo (JP)

(72) Inventors: Kazuhiro Oosawa, Ageo (JP); Ayumu Tateoka, Nantou (TW); Kuniharu Ogawa, Ageo (JP); Haruka Makino, Ageo (JP)

(73) Assignee: MITSUI MINING & SMELTING CO., LTD., Tokyo (JP)

( * ) Notice: Subject to any disclaimer, the term of this patent is extended or adjusted under 35 U.S.C. 154(b) by 0 days.

(21) Appl. No.: 18/276,546

(22) PCT Filed: Jan. 26, 2022

(86) PCT No.: PCT/JP2022/002966
§ 371 (c)(1),
(2) Date: Aug. 9, 2023

(87) PCT Pub. No.: WO2022/172759
PCT Pub. Date: Aug. 18, 2022

(65) Prior Publication Data
US 2024/0101858 A1 Mar. 28, 2024

(30) Foreign Application Priority Data
Feb. 10, 2021 (JP) ................. 2021-019760

(51) Int. Cl.
| | | |
|---|---|---|
| *C09D 153/02* | (2006.01) | |
| *C08F 297/04* | (2006.01) | |
| *C08K 5/06* | (2006.01) | |
| *C09D 125/12* | (2006.01) | |
| *H05K 1/05* | (2006.01) | |

(52) U.S. Cl.
CPC ...... *C09D 153/025* (2013.01); *C08F 297/046* (2013.01); *C08K 5/06* (2013.01); *C09D 125/12* (2013.01); *H05K 1/056* (2013.01); *C08F 2810/20* (2013.01); *H05K 2201/0355* (2013.01); *H05K 2201/0358* (2013.01)

(58) Field of Classification Search
CPC ....................................................... H05K 1/03
See application file for complete search history.

(56) References Cited

U.S. PATENT DOCUMENTS

| | | | |
|---|---|---|---|
| 2002/0004180 A1 | 1/2002 | Hotta et al. | |
| 2006/0041068 A1 | 2/2006 | Ohno et al. | |
| 2012/0125667 A1* | 5/2012 | Jung | H05K 3/4652 174/251 |
| 2017/0145266 A1* | 5/2017 | Scholz | H05K 1/144 |
| 2018/0134842 A1 | 5/2018 | Nagai et al. | |
| 2019/0002689 A1 | 1/2019 | Chen et al. | |
| 2021/0108073 A1 | 4/2021 | Kawabe et al. | |
| 2022/0380538 A1 | 12/2022 | Nosaka et al. | |

FOREIGN PATENT DOCUMENTS

| | | |
|---|---|---|
| JP | 2001-345537 A | 12/2001 |
| JP | 2006-83364 A | 3/2006 |
| JP | 2011-225639 A | 11/2011 |
| JP | 2016-196563 A | 11/2016 |
| JP | 2017-157783 A | 9/2017 |
| JP | 2018-523725 A | 8/2018 |
| JP | 2018-168347 A | 11/2018 |
| JP | 2020-200427 A | 12/2020 |
| WO | 2013/105650 A1 | 7/2013 |
| WO | 2016/104748 A1 | 6/2016 |
| WO | 2016/175326 A1 | 11/2016 |
| WO | 2018/181842 A1 | 10/2018 |
| WO | 2021/065964 A1 | 4/2021 |

* cited by examiner

*Primary Examiner* — Ian A Rummel
(74) *Attorney, Agent, or Firm* — GREENBLUM & BERNSTEIN, P.L.C.

(57) ABSTRACT

There is provided a resin composition exhibiting excellent dielectric properties, high adhesion to a low-roughness surface, heat resistance, and excellent water-resistant reliability. This resin composition includes an arylene ether compound having a weight average molecular weight of 30000 or higher and a styrenic copolymer having, in its molecule, a reactive unsaturated bond that exhibits reactivity by heat or an ultraviolet ray.

7 Claims, No Drawings

RESIN COMPOSITION, COPPER FOIL WITH RESIN, AND PRINTED WIRING BOARD

TECHNICAL FIELD

The present invention relates to a resin composition, a resin-coated copper foil and a printed wiring board.

BACKGROUND ART

Printed wiring boards are widely used for electronic devices and the like. Particularly, frequencies of signals have been made higher with high functionalization of electronic devices and the like in recent years, which enables high-speed and high-capacity communication. Examples of such applications include communication servers, automatic driving of automobiles, and 5G-enabled cellular phones. Printed wiring boards suitable for such high-frequency applications have been demanded. These printed wiring boards for high frequencies are desired to have low transmission loss in order to enable transmission without deterioration in the quality of high-frequency signals. A printed wiring board includes: a copper foil processed into a wiring pattern; and an insulating resin substrate, and the transmission loss includes conductor loss mainly arising from the copper foil and dielectric loss arising from the insulating resin substrate. Accordingly, in a resin layer-attached copper foil which is applied to high-frequency applications, the dielectric loss arising from the resin layer is desirably suppressed. To achieve this, the resin layer is required to have excellent dielectric properties, particularly low dielectric loss tangent.

Meanwhile, various resin compositions superior in dielectric properties, adhesion, and the like have been proposed for applications such as printed wiring boards. For example, Patent Literature 1 (WO2013/105650) discloses an adhesive layer-attached copper foil including an adhesive layer on one surface of a copper foil and states that this adhesive layer comprises a resin composition containing 5 parts by mass or more and 65 parts by mass or less of a styrene butadiene block copolymer based on 100 parts by mass of a polyphenylene ether compound. Further, Patent Literature 2 (WO2016/175326) discloses a resin composition containing (A) a polyphenylene ether derivative having an N-substituted maleimide structure-containing group in one molecule, (B) at least one thermosetting resin selected from the group consisting of an epoxy resin, a cyanate resin and a maleimide compound, and (C) a styrenic thermoplastic elastomer. Patent Literature 3 (JP2011-225639A) discloses a thermosetting resin composition containing an uncured semi-IPN composite and (D) a radical reaction initiator. Patent Literature 3 states that this uncured semi-IPN composite is an uncured composite obtained by compatibilizing (A) a polyphenylene ether with a prepolymer formed from (B) a butadiene polymer containing, in a molecule, 40% or more of a 1,2-butadiene unit having a 1,2-vinyl group in a side chain and (C) a cross linker.

CITATION LIST

Patent Literature

Patent Literature 1: WO2013/105650
Patent Literature 2: WO2016/175326
Patent Literature 3: JP2011-225639A

SUMMARY OF INVENTION

The present inventors have conducted studies on a resin composition which is superior in dielectric properties and the like and which can be adhered as a primer layer (adhesion layer) to a substrate such as a prepreg. The layer of this resin composition can be provided in the form of a resin-coated copper foil, and this copper foil can be used as a copper foil for forming a circuit. A resin composition for the above-described applications is desired to have not only excellent dielectric properties but also various properties such as being superior in adhesion even to a low-roughness surface (for example, a surface of a low-roughness copper foil), having heat resistance, and having excellent water-resistant reliability. In formation of a circuit for high frequencies among others, a low-roughness copper foil is desired from the viewpoint of reduction in transmission loss, but such a copper foil tends to have low adhesion to a resin composition because of low roughness. Therefore, how to achieve both excellent dielectric properties and high adhesion to a low-roughness copper foil while securing other properties is a problem.

The present inventors have discovered that by blending an arylene ether compound having a weight average molecular weight of 30000 or higher with a styrenic copolymer having a reactive unsaturated bond in a molecule, it is possible to provide a resin composition exhibiting excellent dielectric properties (for example, low dielectric loss tangent at 10 GHz), high adhesion to a low-roughness surface (for example, a surface of a low roughness copper foil), heat resistance, and excellent water-resistant reliability.

Accordingly, an object of the present invention is to provide a resin composition exhibiting excellent dielectric properties, high adhesion to a low-roughness surface, heat resistance, and excellent water-resistant reliability.

According to an aspect of the present invention, there is provided a resin composition comprising:
  an arylene ether compound having a weight average molecular weight of 30000 or higher; and
  a styrenic copolymer having, in its molecule, a reactive unsaturated bond that exhibits reactivity by heat or an ultraviolet ray.

According to another aspect of the present invention, there is provided a resin-coated copper foil comprising:
  a copper foil; and
  a resin layer provided on at least one surface of the copper foil and comprising the resin composition.

According to another aspect of the present invention, there is provided a printed wiring board prepared using the resin-coated copper foil.

DESCRIPTION OF EMBODIMENTS

Resin Composition

A resin composition of the present invention comprises an arylene ether compound having a weight average molecular weight of 30000 or higher and a styrenic copolymer. The styrenic copolymer has, in its molecule, a reactive unsaturated bond that exhibits reactivity by heat or an ultraviolet ray. By blending an arylene ether compound having a weight average molecular weight of 30000 or higher with a styrenic copolymer having in its molecule a reactive unsaturated bond in this way, it is possible to provide a resin composition exhibiting excellent dielectric properties (for example, low dielectric loss tangent at 10 GHz), high adhesion to a low-roughness surface (for example, a surface of a low-roughness copper foil), heat resistance, and excellent water-resistant reliability. In addition, this resin composition also has satisfactory processability, and, for example, this resin composition is unlikely to be broken and can exhibit satisfactory tackiness.

As described above, the present inventors have conducted studies on a resin composition which is superior in dielectric properties and the like and which can be adhered as a primer layer (adhesion layer) to a substrate such as a prepreg. The layer of this resin composition can be provided in the form of a resin-coated copper foil, and this copper foil can be used as a copper foil for forming a circuit. A resin composition for the above-described applications is desired to have not only excellent dielectric properties but also various properties such as being superior in adhesion even to a low-roughness surface (for example, a surface of a low-roughness copper foil), having heat resistance, and having excellent water-resistant reliability. In formation of a circuit for high frequencies among others, a low-roughness copper foil is desired from the viewpoint of reduction in transmission loss, but such a copper foil tends to have low adhesion to a resin composition because of low roughness. Due to blending the arylene ether compound having a weight average molecular weight of 30000 or higher with the styrenic copolymer having a reactive unsaturated bond in a molecule, the resin composition of the present invention is tough and can realize high adhesion (high peel strength) to a low-roughness surface while having not only excellent dielectric properties but also heat resistance and water-resistant reliability.

Specifically, the resin composition of the present invention preferably has a dielectric loss tangent at a frequency of 10 GHz after curing of less than 0.0035, more preferably less than 0.0020, and still more preferably less than 0.0015. The dielectric loss tangent is preferably lower, and the lower limit value is not particularly limited, but the dielectric loss tangent is typically 0.0001 or more.

The resin composition of the present invention comprises an arylene ether compound. This arylene ether compound has a weight average molecular weight of 30000 or higher, preferably 30000 or higher and 300000 or lower, still more preferably 40000 or higher and 200000 or lower, and particularly preferably 45000 or higher and 120000 or lower. The arylene ether compound having a weight average molecular weight of 30000 or higher is typically a polyarylene ether. The arylene ether compound is preferably a phenylene ether compound, for example, a polyphenylene ether. The arylene ether compound or phenylene ether compound is preferably a compound including, in a molecule, a backbone represented by the following formula:

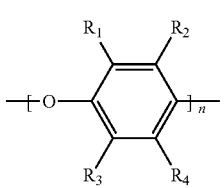

[Formula 1]

wherein $R_1$, $R_2$, $R_3$, $R_4$ each independently represent a hydrogen atom or a hydrocarbon group having 1 or more and 3 or less carbon atoms. Examples of the phenylene ether compound include a styrene derivative of a phenylene ether compound, a phenylene ether compound including a maleic anhydride structure in a molecule, a terminal hydroxy group-modified phenylene ether compound, a terminal methacryl-modified phenylene ether compound, and a terminal glycidyl ether-modified phenylene ether compound. Product examples of the arylene ether compound including a maleic anhydride structure in a molecule and having a weight average molecular weight of 30000 or higher include PME-80 and PME-82 manufactured by Mitsubishi Engineering-Plastics Corporation.

The arylene ether compound of the present invention preferably has a reactive unsaturated bond. Alternatively, the resin composition may be a resin composition further comprising an additional arylene ether compound having a reactive unsaturated bond. In this case, the additional arylene ether compound does not need to have a weight average molecular weight of 30000 or higher. That is, the additional arylene ether compound (may have a weight average molecular weight of 30000 or higher, but) can be an arylene ether compound having a weight average molecular weight of less than 30000 and, for example, can have a number average molecular weight of 500 or higher and 10000 or lower. The reactive unsaturated bond is defined as an unsaturated bond that exhibits reactivity by heat or an ultraviolet ray. Preferred examples of the reactive unsaturated bond include a cyanate group, a maleimide group, a vinyl group, a (meth)acryloyl group, an ethynyl group, a styryl group, and combinations thereof. A styryl group is particularly preferable in that the reactivity is high and the reaction can be controlled (the reaction is unlikely to occur due to a change with time, the resin can be stored, and a long product life can be secured).

The reactive unsaturated bond in the arylene ether compound is preferably at a terminal of the molecular structure or at a position adjacent to the terminal because of exhibiting high reactivity. Examples of functional groups having an unsaturated bond at a terminal of the molecular structure include a 1,2-vinyl group, and a 1,2-vinyl group is generally used as a functional group that can be used for radical polymerization because of exhibiting high reactivity. On the other hand, in the case of an ethylenically unsaturated bond present in the molecular backbone (a vinyl group which is not at a terminal of the molecular structure), the reactivity lowers. Exceptionally, when a benzene ring is adjacent to an unsaturated bond (for example, in the case of a styryl group), the unsaturated bond has high reactivity. Accordingly, the position of the reactive unsaturated bond may be a) a terminal (the terminal may be a terminal of the main chain or of a side chain) of the molecular structure, or b) when a benzene ring is at a terminal (the terminal may be a terminal of the main chain or of a side chain) of the molecular structure, the position of the reactive unsaturated bond may be a position adjacent to the benzene ring which is at the terminal. For example, the arylene ether compound may have a styryl group as a reactive unsaturated bond at both terminals of the molecular structure. Product examples of the arylene ether compound having a styryl group at both terminals of a molecule include OPE-2St-1200 and OPE-2St-2200 manufactured by MITSUBISHI GAS CHEMICAL COMPANY, INC.

The content of the arylene ether compound having a weight average molecular weight of 30000 or higher in the resin composition of the present invention is not particularly limited, and is preferably 10 parts by weight or more and 60 parts by weight or less, more preferably 15 parts by weight or more and 55 parts by weight or less, still more preferably 20 parts by weight or more and 50 parts by weight or less, and particularly preferably 25 parts by weight or more and 35 parts by weight or less, based on 100 parts by weight of the total amount of the resin component (solid content), from the viewpoint of achieving both compatibility (having relevance to peel strength and water-resistant reliability) and dielectric properties.

The resin composition of the present invention comprises a styrenic copolymer. The styrenic copolymer may be any of a hydrogenated polymer or a non-hydrogenated polymer. That is, the styrenic copolymer is a compound comprising a site derived from styrene and is a polymer which may comprise a site derived from a compound having a polymerizable unsaturated group, such as an olefin, in addition to styrene. When, at a site of the styrenic copolymer, the site derived from a compound having a polymerizable unsaturated bond, a double bond is further present, the double bond site may be a hydrogenated double bond site or may be a non-hydrogenated double bond site. Examples of the styrenic copolymer include an acrylonitrile-butadiene-styrene copolymer (ABS), a methacrylate-butadiene-styrene copolymer (MBS), an acrylonitrile-acrylate-styrene copolymer (AAS), an acrylonitrile-ethylene-styrene copolymer (AES), a styrene-butadiene copolymer (SBR), a styrene-butadiene-styrene copolymer (SBS), a styrene-ethylene-butadiene-styrene copolymer (SEBS), a styrene-4-methylstyrene-isoprene-butadiene block copolymer, and combinations thereof, and preferred styrenic copolymers include a styrene-butadiene block copolymer (SBR), a styrene-4-methylstyrene-isoprene-butadiene block copolymer, and combinations thereof, and a particularly preferred styrenic copolymer is a styrene-4-methylstyrene-isoprene-butadiene block copolymer. The weight average molecular weight of the styrenic copolymer is not particularly limited, and is preferably 40000 or higher and 400000 or lower, more preferably 60000 or higher and 370000 or lower, and particularly preferably 80000 or higher and 340000 or lower.

The styrenic copolymer of the present invention has a reactive unsaturated bond in a molecule. As described above, the reactive unsaturated bond is defined as an unsaturated bond that exhibits reactivity by heat or an ultraviolet ray. Preferred examples of the reactive unsaturated bond include a cyanate group, a maleimide group, a vinyl group, a (meth)acryloyl group, an ethynyl group, a styryl group, and combinations thereof. A styryl group is particularly preferable in that the reactivity is high and the reaction can be controlled (the reaction is unlikely to occur due to a change with time, the resin can be stored, and a long product life can be secured).

The reactive unsaturated bond in the styrenic copolymer as well as the arylene ether compound is preferably at a terminal of the molecular structure or at a position adjacent to the terminal because of exhibiting high reactivity. Examples of functional groups having an unsaturated bond at a terminal of the molecular structure include a 1,2-vinyl group, and a 1,2-vinyl group is generally used as a functional group that can be used for radical polymerization because of exhibiting high reactivity. On the other hand, in the case of an ethylenically unsaturated bond present in the molecular backbone (a vinyl group which is not at a terminal of the molecular structure), the reactivity lowers. Exceptionally, when a benzene ring is adjacent to an unsaturated bond (for example, in the case of a styryl group), the unsaturated bond has high reactivity. Accordingly, the position of the reactive unsaturated bond may be a) a terminal (the terminal may be a terminal of the main chain or of a side chain) of the molecular structure, or b) when a benzene ring is at a terminal (the terminal may be a terminal of the main chain or of a side chain) of the molecular structure, the position of the reactive unsaturated bond may be a position adjacent to the benzene ring which is at the terminal. Product examples of the styrenic copolymer having a reactive unsaturated bond include SEPTON® V9461 (having a styryl group) manufactured by Kuraray Co., Ltd., Ricon® 100, 181, and 184 (styrene-butadiene copolymers having a 1,2-vinyl group) manufactured by CRAY VALLEY SA, and EPOFRIEND AT501 and CT310 (styrene butadiene copolymers having a 1,2-vinyl group) manufactured by Daicel Corporation.

The styrenic copolymer preferably has modified styrene butadiene. Alternatively, the resin composition may be a resin composition further comprising an additional styrenic copolymer having modified styrene butadiene. In this case, as the additional styrenic copolymer, the same styrenic copolymers as those described above can be used except that the additional styrenic copolymer does not need to have a reactive unsaturated bond. That is, the additional styrenic copolymer (may be a styrenic copolymer having a reactive unsaturated bond, but) can be a styrenic copolymer free of a reactive unsaturated bond. The modified styrene butadiene may be styrene butadiene chemically modified by introducing various functional groups, and examples of modification include amine modification, pyridine modification, and carboxy modification, but the modification is preferably amine modification. Examples of the styrenic copolymer having modified styrene butadiene include Tuftec® MP10 manufactured by Asahi Kasei Corp., which is a hydrogenated styrene butadiene block copolymer and is an amine-modified product. In addition, examples of the unmodified styrenic copolymer include TR2003 manufactured by JSR Corporation, which is a styrene butadiene block copolymer.

The content of the styrenic copolymer having a reactive unsaturated bond in the resin composition of the present invention is not particularly limited, and is preferably 5 parts by weight or more and 75 parts by weight or less, more preferably 10 parts by weight or more and 65 parts by weight or less, still more preferably 15 parts by weight or more and 55 parts by weight or less, and particularly preferably 20 parts by weight or more and 43 parts by weight or less, based on 100 parts by weight of the total amount of the resin component (solid content), from the viewpoint of achieving both compatibility and dielectric properties.

The content ratio of the arylene ether compound having a weight average molecular weight of 30000 or higher to the styrenic copolymer having a reactive unsaturated bond in a molecule in the resin composition of the present invention is not particularly limited, but from the viewpoint of striking a balance among adhesion, compatibility, and dielectric properties, when the content of the arylene ether compound having a weight average molecular weight of 30000 or higher is assumed to be P, and the content of the styrenic copolymer having a reactive unsaturated bond in a molecule is assumed to be S, a weight ratio (S/P ratio) obtained by dividing S by P is preferably 0.2 or more and 2.0 or less, more preferably 0.4 or more and 1.8 or less, still more preferably 0.6 or more and 1.7 or less, and particularly preferably 1.0 or more and 1.5 or less.

The resin composition of the present invention may further comprise an additive which is generally added to a resin or a polymer. Examples of the additive include a reaction initiator, a reaction accelerator, a flame retardant, a silane coupling agent, a dispersant, and an antioxidant.

The resin composition of the present invention may further comprise an inorganic filler. Examples of the inorganic filler include silica, talc, alumina, and boron nitride (BN). The inorganic filler is not particularly limited as long as it can be dispersed in the resin composition, and is preferably silica from the viewpoint of dispersibility and dielectric properties. The average particle size D50 of the inorganic filler is preferably 0.1 µm or larger and 3.0 µm or smaller, and more preferably 0.3 µm or larger and 2.0 µm or smaller. When the inorganic filler has an average particle size D50 within such ranges, the number of interfaces (namely, the specific surface area) is decreased, and thereby an adverse influence on the dielectric properties can be reduced, and preferred properties as an electronic material, such as an improvement in interlayer insulation and disappearance of coarse particles in the resin layer, are brought about. The inorganic filler may take any form of a pulverized particle, a spherical particle, a core-shell particle, a hollow particle, and the like. The content of the inorganic filler may be an arbitrary amount and is not particularly limited, and is preferably 0 parts by weight or more and 150 parts by weight or less, more preferably 10 parts by weight or more and 130 parts by weight or less, still more preferably 20 parts by weight or more and 100 parts by weight or less, and particularly preferably 30 parts by weight or more and 80 parts by weight or less, based on 100 parts by weight of the total amount of the above-described resin component (solid content), from the viewpoint of ease of dispersing the filler, fluidity of the resin composition, and the like. The 100 parts by weight of the total amount of the resin component (solid content) herein includes not only the weight of polymers and resins but also the weight of additives, such as a reaction initiator, which are to form a part of the resins, but does not include the amount of the inorganic filler.

Resin-Coated Copper Foil

The resin composition of the present invention is preferably used as a resin for a resin-coated copper foil. That is, according to a preferred aspect of the present invention, a resin-coated copper foil comprising a copper foil and a resin layer provided on at least one surface of the copper foil and comprising the resin composition is provided. Typically, the resin composition takes a form of a resin layer, and the resin composition is applied and dried on the copper foil using a gravure coating method in such a way that the thickness of the resin layer after drying takes a predetermined value, thereby obtaining the resin-coated copper foil. This coating method may be arbitrary, but the gravure coating method and other methods such as a die coating method and a knife coating method can be adopted. In addition, the resin composition can also be applied using a doctor blade, a bar coater, or the like.

As described above, the resin composition of the present invention exhibits excellent dielectric properties (for example, low dielectric loss tangent at 10 GHz), high adhesion to a low-roughness surface (for example, a surface of a low-roughness copper foil), heat resistance, and excellent water-resistant reliability. Accordingly, the resin-coated copper foil has various advantages brought about by such a resin composition. For example, the resin-coated copper foil preferably has a lower limit value of the peel strength (that is, peel strength in a normal state) between the resin layer and the copper foil, measured in accordance with JIS C 6481-1996 in a state where the resin layer is cured, of 0.8 kgf/cm or more, more preferably 1.0 kgf/cm or more, and particularly preferably 1.2 kgf/cm or more. The peel strength is better when it is higher, and the upper limit value thereof is not particularly limited, but is typically 2.0 kgf/cm or less.

The thickness of the resin layer is not particularly limited, but appropriate thickness exists because the resin layer is preferably thicker and a multilayer substrate is preferably thinner in order to secure the peel strength. The thickness of the resin layer is preferably 1 μm or more and 50 μm or less, more preferably 1.5 μm or more and 30 μm or less, particularly preferably 2 μm or more and 20 μm or less, and most preferably 2.5 μm or more and 10 μm or less. When the thickness of the resin layer is within these ranges, thereby the above-described properties of the present invention can be realized more effectively, and the resin layer is easily formed by the application of the resin composition.

The copper foil may be a metal foil as produced by electrodepositing foil production or rolling foil production (that is, a raw foil) or may take a form of a surface-treated foil for which a surface treatment is performed on at least any one of the surfaces. The surface treatment can be any of various surface treatments which are performed on a surface of a metal foil in order to improve or impart a certain characteristic (for example, rust proofing performance, humidity resistance, chemical resistance, acid resistance, heat resistance, and adhesion to a substrate). The surface treatment may be performed on one surface of the metal foil or may be performed on both surfaces of the metal foil. Examples of the surface treatment which is performed on the copper foil include a rust proofing treatment, a silane treatment, a roughening treatment, and a barrier-forming treatment.

The surface of the resin layer side of the copper foil preferably has a ten-point average roughness Rzjis, as measured in accordance with JIS B0601-2001, of 2.0 μm or less, more preferably 1.5 μm or less, still more preferably 1.0 μm or less, particularly preferably 0.7 μm or less, and most preferably 0.5 μm or less. When the ten-point average roughness is within such ranges, the transmission loss in the high-frequency applications can desirably be reduced. That is, conductor loss which appears more remarkably when the frequency is higher, which can be increased by a skin effect of the copper foil, and which arises from the copper foil can be reduced, so that further reduction in the transmission loss can be realized. The lower limit value of the ten-point average roughness Rzjis of the surface on the resin layer side of the copper foil is not particularly limited, but from the viewpoint of an improvement in the adhesion to the resin layer and of the heat resistance, Rzjis is preferably 0.01 μm or more, more preferably 0.03 μm or more, and still more preferably 0.05 μm or more.

The thickness of the copper foil is not particularly limited but is preferably 0.1 μm or more and 100 μm or less, more preferably 0.5 μm or more and 70 μm or less, still more preferably 1 μm or more and 50 μm or less, particularly preferably 1.5 μm or more and 30 μm or less, and most preferably 2 μm or more and 20 μm or less. When the copper foil has a thickness within such ranges, there is an advantage that a fine circuit can be formed. However, in the case where the thickness of the copper foil is, for example, 10 μm or less, the resin-coated copper foil of the present invention may be a carrier-attached copper foil including a release layer and a carrier for the purpose of improving handleability, the carrier-attached copper foil having a resin layer formed on the surface of the copper foil thereof.

From the viewpoint of securing the adhesion to the resin layer, the substrate such as a prepreg preferably comprises a resin having a reactive unsaturated bond in a molecule, and from the viewpoint of the compatibility with the resin layer, the substrate such as a prepreg preferably comprises a polyphenylene ether resin. Examples of commercially available substrates satisfying both of comprising a resin having a reactive unsaturated bond in a molecule and comprising a polyphenylene ether resin include MEGTRON6 series, MEGTRON7 series, and MEGTRON8 series manufactured by Panasonic Corporation. With regard to substrates, such as those exemplified herein, having a low dielectric constant and low dielectric loss tangent, it has been difficult to secure the adhesion to not only a conventional resin layer but also a low roughness copper foil, but when the resin composition of the present invention is used, thereby sufficient adhesion can be secured. Accordingly, according to a preferred aspect of the present invention, there is provided a stack including a substrate (for example, a prepreg) and a resin layer (or the resin-coated copper foil of the present invention) provided on one surface or both surfaces of the substrate and comprising the resin composition of the present invention.

Printed Wiring Board

The resin composition or resin-coated copper foil of the present invention is preferably used for preparing a printed wiring board. That is, according to a preferred aspect of the present invention, there is provided a printed wiring board comprising the resin-coated copper foil, or a printed wiring board prepared using the resin-coated copper foil. In this case, the resin layer of the resin-coated copper foil has been cured. The printed wiring board according to the present aspect comprises a layer configuration in which an insulating resin layer and a copper layer are stacked in the mentioned order. A known layer configuration can be adopted for the printed wiring board. Specific examples regarding the printed wiring board include a single-sided or double-sided printed wiring board obtained in such way that the resin-coated copper foil of the present invention is bonded to one surface or both surfaces of a prepreg and cured to make a stack, and then a circuit is formed, and a multilayer printed wiring board obtained by making these into a multilayer stack. In addition, other specific examples include a flexible printed wiring board obtained by forming the resin-coated copper foil of the present invention on a resin film to form a circuit, COF, a TAB tape, a buildup multilayer printed wiring board, and direct-buildup-on-wafer in which stacking a resin-coated copper foil on a semiconductor integrated circuit and forming a circuit are alternately repeated. Particularly, the resin-coated copper foil of the present invention is preferably applicable to an insulating layer and a conductor layer for a printed wiring board for high-frequency digital communication in a network device. Examples of such a network device include (i) a server, a router, and the like in a base station, (ii) an intranet, and (iii) a core system for high-speed portable communication.

EXAMPLES

The present invention will be described more specifically with reference to the following Examples.

Examples 1 to 12

(1) Preparation of Resin Varnish

Firstly, arylene ether compounds, styrenic copolymers, an additive, and an inorganic filler, described below, were provided as raw material components for resin varnishes.

<Arylene Ether Compounds>
  OPE-2St-1200 (manufactured by MITSUBISHI GAS CHEMICAL COMPANY, INC., phenylene ether compound having a styryl group at both terminals of a molecule, number average molecular weight about 1200)
  OPE-2St-2200 (manufactured by MITSUBISHI GAS CHEMICAL COMPANY, INC., phenylene ether compound having a styryl group at both terminals of a molecule, number average molecular weight about 2200)
  PME-82 (manufactured by Mitsubishi Engineering-Plastics Corporation, phenylene ether compound including a maleic anhydride structure in a molecule, weight average molecular weight about 56000)

<Styrenic Copolymers>
  SEPTON® V9461 (manufactured by Kuraray Co., Ltd., hydrogenated styrene-4-methylstyrene-isoprene-butadiene block copolymer having a styryl group, weight average molecular weight about 296000)
  EPOFRIEND AT501 (manufactured by Daicel Corporation, epoxidized styrenic copolymer having a 1,2-vinyl group, weight average molecular weight about 94000)
  TR2003 (manufactured by JSR Corporation, styrene butadiene block copolymer, weight average molecular weight about 95700)
  Tuftec® MP10 (manufactured by Asahi Kasei Corp., hydrogenated styrene butadiene block copolymer, amine-modified product, weight average molecular weight about 60000)

<Additive (Reaction Initiator)>
  PERBUTYL P (manufactured by NOF CORPORATION, peroxide)

<Inorganic Filler>
  SC4050-MOT (manufactured by Admatechs Company Limited, silica slurry, average particle size D50: 1.0 μm, surface-treated with vinylsilane)

Note that the above-described number average molecular weights and weight average molecular weights of the arylene ether compounds and the styrenic copolymers are values obtained by measurement under the following conditions using a GPC (gel permeation chromatograph) method. Each of the above-described molecular weights is a relative value based on polystyrene.

Detector: differential refractive index detector RI (RI-8020, manufactured by Tosoh Corporation, sensitivity 32)
  Columns: TSKgel GMH$_{HR}$-M, two columns (7.8 mm×30 cm, manufactured by Tosoh Corporation)
  Solvent: chloroform
  Flow rate: 1.0 mL/min
  Column temperature: 40° C.
  Injection amount: 0.2 mL
  Standard sample: monodispersed polystyrene, manufactured by Tosoh Corporation
  Data processing: GPC data processing system, manufactured by Toray Research Center, Inc.

The raw material components were weighed according to the blending ratio (weight ratio) shown in Table 1 and placed in a round flask, and a mixed solvent was added in such a way that the concentration of the raw material components was 13% by weight or 17% by weight. This mixed solvent was added in a mixing ratio that made the ratio of organic solvents in the resin varnishes 85% by weight of toluene and 15% by weight of methyl ethyl ketone. To the round flask in which the raw material components and the mixed solvent were placed, a mantle heater and a flask cap with a stirring blade and a reflux condenser were installed, and after the temperature was increased to 60° C. under stirring, the stirring was continued at 60° C. for 2 hours to dissolve or disperse the raw material components. A resultant resin varnish was allowed to cool after the stirring. Thus, a resin varnish having a concentration of the raw material components of 13% by weight and a resin varnish having a concentration of the raw material components of 17% by weight were obtained.

(2) Preparation of Electrodeposited Copper Foil

An electrodeposited copper foil was prepared by the following method. Electrolysis was performed using a rotating electrode (surface roughness Ra: 0.20 μm) made of titanium as a cathode and a dimension stable anode (DSA) as an anode in a copper sulfate solution at a solution temperature of 45° C. and a current density of 55 A/dm² to prepare an electrodeposited copper foil as a raw foil. The composition of this copper sulfate solution was set in such a way that the concentration of copper was 80 g/L, the concentration of free sulfuric acid was 140 g/L, the concentration of bis(3-sulfopropyl)disulfide was 30 mg/L, the concentration of a diallyl dimethyl ammonium chloride polymer was 50 mg/L, and the concentration of chlorine was 40 mg/L. Particulate protrusions were formed on the surface of the raw foil on the electrolytic solution surface side. The particulate protrusions were formed by performing electrolysis in a copper sulfate solution (concentration of copper: 13 g/L, concentration of free sulfuric acid 55 g/L, concentration of 9-phenyl acridine 140 mg/L, concentration of chlorine: 35 mg/L) under a condition of a solution temperature of 30° C. and a current density of 50 A/dm².

Zinc-nickel coat formation, chromate layer formation, and silane layer formation were performed in sequence under the conditions described below on the electrolytic solution surface side of the raw foil thus obtained.

<Zinc-Nickel Coat Formation>
 Concentration of potassium pyrophosphate: 80 g/L
 Concentration of zinc: 0.2 g/L
 Concentration of nickel: 2 g/L
 Liquid temperature: 40° C.
 Current density: 0.5 A/dm²
<Chromate Layer Formation>
 Concentration of chromic acid: 1 g/L, pH 11
 Solution temperature: 25° C.
 Current density: 1 A/dm²
<Silane Layer Formation>
 Silane coupling agent: 3-aminopropyl trimethoxysilane (3 g/L aqueous solution)
 Liquid treatment method: shower treatment The surface-treated surface of this electrodeposited copper foil had a ten-point average roughness Rzjis of 0.5 μm (in accordance with JIS B0601-2001), and the particulate protrusions had an average particle size of 100 nm as measured using a scanning electron microscopic image, and a particle density of 205 particles/μm². The electrodeposited copper foil including the surface-treated surface had a total thickness of 18 μm.

(3) Preparation of Resin Film

The obtained resin varnish having a concentration of the raw material components of 17% by weight was applied on the surface of a release film ("Aflex®" manufactured by AGC Inc.) using a comma coater in such a way that the thickness of the resin after drying was 20 μm, and the applied resin varnish was dried in an oven at 150° C. for 3 minutes to obtain a B-stage resin. The release film was released from the obtained B-stage resin, and 2 sheets of only the B-stage resins were stacked to apply vacuum pressing under a condition of 200° C., 90 minutes, and 20 kgf/cm², and thus a resin film having a thickness of 40 μm was obtained.

(4) Preparing Single-Sided Multilayer Substrate

The obtained resin varnish having a concentration of the raw material components of 13% by weight was applied on the surface of the electrodeposited copper foil using a gravure coater in such a way that the thickness of the resin after drying was 4 μm, and the applied resin varnish was dried in an oven at 150° C. for 2 minutes to obtain a resin-coated copper foil. A plurality of prepregs (MEGTRON7 series "R-5680," manufactured by Panasonic Corporation) was stacked to make the thickness 0.2 mm, and the resin-coated copper foil was stacked thereon in such a way that the resin was in contact with the prepreg to apply vacuum pressing under a condition of 190° C., 90 minutes, and 30 kgf/cm², and thus a single-sided multilayer substrate was obtained.

(5) Evaluations

The following evaluations were performed for the prepared resin film and single-sided multilayer substrate. Note that the meaning of each evaluation criterion considering the state of the art is as follows; rating A: particularly excellent, rating B: excellent, rating C: practically usable, and rating D: not usable.

<Evaluation 1: Peel Strength>

Copper wiring having a wiring width of 10 mm and a wiring thickness of 18 μm was formed on the single-sided multilayer substrate by a subtractive method to measure the peel strength at normal temperature (for example, 25° C.) in accordance with JIS C 6481-1996. The measurement was performed 5 times, the average value was adopted as the value of the peel strength, and the peel strength was evaluated according to the following criteria. Note that the peel strength measured herein is a value in which four peeling modes, interfacial peeling between the prepreg/the resin, cohesive failure of the resin, phase interfacial peeling in the resin layer, and interfacial peeling between the resin/the copper foil, are reflected, and when the value is higher, it means that the copper wiring is more superior in adhesion to the substrate, such as the prepreg, strength of the resin layer, and adhesion of the resin to the low-roughness foil. The results applied to the following criteria were as shown in Table 1.

Rating A: 1.2 kgf/cm or more
 Rating B: 1.0 kgf/cm or more and less than 1.2 kgf/cm
 Rating C: 0.8 kgf/cm or more and less than 1.0 kgf/cm
 Rating D: less than 0.8 kgf/cm <Evaluation 2: Heat Resistance>

The single-sided multilayer substrate was cut out into test pieces having a size of 5 cm×5 cm, and the test pieces were allowed to float on a solder bath set at 288° C. for 10 minutes to observe whether blister occurred or not. Four test pieces were prepared for the evaluation. The results applied to the following criteria were as shown in Table 1.

Rating A: blister does not occur for all the test pieces
 Rating C: blister of a diameter of less than 5 mm occurs at 1 spot or more and less than 3 spots for one or more test pieces
 Rating D: blister of a diameter of less than 5 mm occurs at 3 spots or more for one or more test pieces, or blister of a diameter of 5 mm or more occurs at 1 spot or more for one or more test pieces <Evaluation 3: Water-Resistant Reliability>

The single-sided multilayer substrate was cut out into test pieces having a size of 5 cm×6 cm, copper in an area of 1 cm×5 cm at one end of each test piece was etched away to use the end as a grip, and thus 4 test pieces each having an area of copper of 5 cm×5 cm were prepared. The grips of the test pieces were sandwiched with jigs, and the test pieces were sunk in boiling water to be subjected to a boiling treatment for 3 hours. After the boiling treatment, water droplets on the test pieces were wiped away, and the test pieces were subjected to a dipping treatment in a solder bath set at 260° C. for 20 seconds to observe whether or not blister occurred to the test pieces taken out. Four test pieces were prepared to perform the evaluation. The results applied to the following criteria were as shown in Table 1.

Rating A: blister does not occur for all the test pieces
 Rating C: blister of a diameter of less than 5 mm occurs at 1 spot or more and less than 3 spots for one or more test pieces Rating D: blister of a diameter of less than 5 mm occurs at 3 spots or more for one or more test pieces, or blister of a diameter of 5 mm or more occurs at 1 spot or more for one or more test pieces <Evaluation 4: Dielectric Loss Tangent>

The dielectric loss tangent at 10 GHz was measured for the resin film by a perturbation cavity resonator method. After the resin film was cut to match the sample size of the resonator, this measurement was performed using a measurement apparatus (the resonator manufactured by KEYCOM Corp., and a network analyzer manufactured by KEYSIGHT Technologies) in accordance with JIS R 1641. The measured dielectric loss tangent was rated according to the following criteria. The results were as shown in Table 1.

Rating A: the dielectric loss tangent at 10 GHz is less than 0.0015

Rating B: the dielectric loss tangent at 10 GHz is 0.0015 or more and less than 0.0020

Rating C: the dielectric loss tangent at 10 GHz is 0.0020 or more and less than 0.0040

Rating D: the dielectric loss tangent at 10 GHz is 0.0040 or more

TABLE 1

| | | | | Example 1 | Example 2 | Example 3 | Example 4 | Example 5 | Example 6 | Example 7 |
|---|---|---|---|---|---|---|---|---|---|---|
| Resin composition | Blending ratio of resin components (parts by weight) | Arylene ether compound | OPE-2St-1200 | 6.70 | 6.00 | 6.00 | 6.00 | 6.00 | 8.76 | 7.29 |
| | | | OPE-2St-2200 | 20.10 | 18.10 | 15.10 | 15.10 | 15.10 | 22.05 | 18.35 |
| | | | PME-82 | 30.20 | 27.10 | 30.10 | 30.10 | 30.10 | 43.95 | 36.58 |
| | | Styrenic copolymer | V9461 | 42.50 | 38.20 | 38.20 | 38.20 | 38.20 | 10.00 | 25.00 |
| | | | AT501 | — | — | — | — | — | — | — |
| | | | TR2003 | — | — | — | — | — | — | — |
| | | | MP10 | — | 10.10 | 10.10 | 10.10 | 10.10 | 14.75 | 12.27 |
| | | Additive (reaction initiator) | PERBUTYL P | 0.50 | 0.50 | 0.50 | 0.50 | 0.50 | 0.50 | 0.50 |
| | | Total (solid content) | | 100.00 | 100.00 | 100.00 | 100.00 | 100.00 | 100.00 | 100.00 |
| | Blending ratio of inorganic filler (parts by weight) | SC4050-MOT | | 50.00 | 50.00 | 50.00 | 75.00 | — | 50.00 | 50.00 |
| | S/P ratio | | | 1.41 | 1.41 | 1.27 | 1.27 | 1.27 | 0.23 | 0.68 |
| Evaluation results | Peel strength (kgf/cm) | | | C 0.99 | A 1.21 | A 1.24 | B 1.05 | B 1.06 | B 1.01 | B 1.15 |
| | Heat resistance | | | A | A | A | A | A | A | A |
| | Water-resistant reliability | | | A | A | A | A | A | A | A |
| | Dielectric loss tangent (Df@10 GHz) | | | A 0.0013 | A 0.0012 | A 0.0012 | A 0.0012 | A 0.0012 | B 0.0015 | A 0.0014 |

| | | | | Example 8 | Example 9 | Example 10* | Example 11* | Example 12* |
|---|---|---|---|---|---|---|---|---|
| Resin composition | Blending ratio of resin components (parts by weight) | Arylene ether compound | OPE-2St-1200 | 5.33 | 6.00 | 6.00 | 8.60 | 6.00 |
| | | | OPE-2St-2200 | 13.42 | 15.10 | 15.10 | 21.65 | 15.10 |
| | | | PME-82 | 26.76 | 30.10 | 30.10 | — | 30.10 |
| | | Styrenic copolymer | V9461 | 45.00 | — | — | 54.77 | — |
| | | | AT501 | — | 38.20 | — | — | — |
| | | | TR2003 | — | — | 38.20 | — | — |
| | | | MP10 | 8.98 | 10.10 | 10.10 | 14.48 | 48.30 |
| | | Additive (reaction initiator) | PERBUTYL P | 0.50 | 0.50 | 0.50 | 0.50 | 0.50 |
| | | Total (solid content) | | 100.00 | 100.00 | 100.00 | 100.00 | 100.00 |
| | Blending ratio of inorganic filler (parts by weight) | SC4050-MOT | | 50.00 | 50.00 | 50.00 | 50.00 | 50.00 |
| | S/P ratio | | | 1.68 | 1.27 | Calculation impossible (0) | Calculation impossible (∞) | Calculation impossible (0) |
| Evaluation results | Peel strength (kgf/cm) | | | A 1.37 | B 1.08 | B 1.04 | A 1.43 | A 1.23 |
| | Heat resistance | | | A | A | A | A | A |
| | Water-resistant reliability | | | C | A | D | D | D |
| | Dielectric loss tangent (Df@10 GHz) | | | A 0.0010 | C 0.0034 | B 0.0015 | A 0.0008 | A 0.0011 |

*denotes Comparative Example.

"—" denotes not blended (0 parts by mass).

The invention claimed is:

1. A resin composition comprising:
   an arylene ether compound having a weight average molecular weight of 30000 or higher; and
   a styrenic copolymer having, in its molecule, a reactive unsaturated bond that exhibits reactivity by heat or an ultraviolet ray, wherein the reactive unsaturated bond is at least one selected from the group consisting of a cyanate group, a maleimide group, a vinyl group, a (meth)acryloyl group, an ethynyl group, and a styryl group;
   wherein a content of the arylene ether compound is 25 parts by weight or more and 60 parts by weight or less based on 100 parts by weight of the total amount in terms of solid content of resin components of the resin composition; and
   wherein a content of the styrenic copolymer is 10 parts by weight or more and 43 parts by weight or less, based on 100 parts by weight of the total amount in terms of solid content of resin components of the resin composition.

2. The resin composition according to claim 1, wherein (i) the arylene ether compound has a reactive unsaturated bond that exhibits reactivity by heat or an ultraviolet ray, or wherein (ii) the resin composition further comprises an additional arylene ether compound having a reactive unsaturated bond that exhibits reactivity by heat or an ultraviolet ray.

3. The resin composition according to claim 1, wherein the styrenic copolymer has a styryl group as the reactive unsaturated bond.

4. The resin composition according to claim 1, wherein the content of the styrenic copolymer is 25 parts by weight or more and 43 parts by weight or less, based on 100 parts by weight of the total amount in terms of solid content of resin components of the resin composition.

5. A resin-coated copper foil comprising:
   a copper foil; and
   a resin layer provided on at least one surface of the copper foil and comprising the resin composition according to claim 1.

6. The resin-coated copper foil according to claim 5, wherein a surface of the resin layer side of the copper foil has a ten-point average roughness Rzjis of 2.0 μm or less as measured in accordance with JIS B0601-2001.

7. A printed wiring board prepared using the resin-coated copper foil according to claim 5.

* * * * *